(12) United States Patent
Naquin et al.

(10) Patent No.: US 12,327,829 B2
(45) Date of Patent: Jun. 10, 2025

(54) RUGGED LDMOS WITH FIELD PLATE

(71) Applicant: Texas Instruments Incorporated, Dallas, TX (US)

(72) Inventors: Clint Alan Naquin, Plano, TX (US); Henry Litzmann Edwards, Garland, TX (US); Alexei Sadovnikov, Sunnyvale, CA (US)

(73) Assignee: Texas Instruments Incorporated, Dallas, TX (US)

( * ) Notice: Subject to any disclaimer, the term of this patent is extended or adjusted under 35 U.S.C. 154(b) by 346 days.

(21) Appl. No.: 17/710,773

(22) Filed: Mar. 31, 2022

(65) Prior Publication Data
US 2023/0317846 A1  Oct. 5, 2023

(51) Int. Cl.
*H01L 29/78* (2006.01)
*H01L 29/06* (2006.01)
*H01L 29/66* (2006.01)

(52) U.S. Cl.
CPC ...... *H01L 29/7823* (2013.01); *H01L 29/0653* (2013.01); *H01L 29/66689* (2013.01)

(58) Field of Classification Search
CPC ............. H01L 29/7823; H01L 29/0653; H01L 29/66689; H01L 29/0692; H01L 29/4238; H01L 29/665; H01L 29/66659; H01L 29/1083; H01L 29/7835; H01L 29/66681–66704; H01L 29/7816–7826; H01L 29/402–407; H01L 21/823878; H10D 30/655; H10D 30/0285; H10D 62/116; H10D 62/199; H10D 18/00; H10D 30/0196
See application file for complete search history.

(56) References Cited

U.S. PATENT DOCUMENTS

| | | | |
|---|---|---|---|
| 2013/0277741 A1* | 10/2013 | Guowei | H01L 29/7835 257/E29.256 |
| 2017/0104097 A1* | 4/2017 | Park | H01L 29/7835 |
| 2023/0045843 A1* | 2/2023 | Yeh | H01L 21/26513 |

* cited by examiner

*Primary Examiner* — Shahed Ahmed
(74) *Attorney, Agent, or Firm* — Andrew R. Ralston; Frank D. Cimino (57) ABSTRACT

A microelectronic device including a substrate having a semiconductor material containing a laterally diffused metal oxide semiconductor (LDMOS) transistor, including a body region of a first conductivity type and a drift region of an opposite conductivity type. A gate dielectric layer over a channel region of the body, the gate dielectric extending over a junction between a body region and the drift region with a gate electrode on the gate dielectric and a drain contact in the drain drift region, having the second conductivity type. A field relief dielectric layer on the drain drift region extending from the drain region to the gate dielectric, having a thickness greater than the gate dielectric layer. A silicide-blocking layer extends from the drain region toward the gate, providing an unsilicided portion of the drift region at the substrate top surface between the drain region and the gate.

16 Claims, 9 Drawing Sheets

RUGGED LDMOS WITH FIELD PLATE

FIELD

This disclosure relates to the field of microelectronic devices. More particularly, but not exclusively, this disclosure relates to laterally diffused metal oxide semiconductor (LDMOS) devices.

BACKGROUND

As power microelectronic devices such as DC-DC-converters are scaled to the next generation of devices, there is a desire to improve performance, decrease die size, and increase the safe operating area (SOA) of the microelectronic device. Increasing the SOA of the microelectronic device is a method to improve the overall ruggedness of the device.

SUMMARY

This summary is provided to introduce a brief selection of disclosed concepts in a simplified form that are further described below in the detailed description including the drawings provided. This summary is not intended to limit the claimed subject matter's scope.

Disclosed examples include microelectronic devices including drain extended metal oxide semiconductor (MOS) transistors, referred to herein as DEMOS transistors, that include an unsilicided space adjacent to the drain ohmic contact regions. Disclosed examples provide an associated process flow for forming such DEMOS transistors.

DETAILED DESCRIPTION

The present disclosure is described with reference to the attached figures. The figures are not drawn to scale and they are provided merely to illustrate the disclosure. Several aspects of the disclosure are described below with reference to example applications for illustration. It should be understood that numerous specific details, relationships, and methods are set forth to provide an understanding of the disclosure. The present disclosure is not limited by the illustrated ordering of acts or events, as some acts may occur in different orders and/or concurrently with other acts or events. Furthermore, not all illustrated acts or events are required to implement a methodology in accordance with the present disclosure.

In this disclosure and the claims that follow, unless stated otherwise and/or specified to the contrary, any one or more of the layers set forth herein can be formed in any number of suitable ways, such as with spin-on techniques, sputtering techniques (e.g., Magnetron and/or ion beam sputtering), thermal growth techniques or deposition techniques such as chemical vapor deposition (CVD), physical vapor deposition (PVD), PECVD, or atomic layer deposition (ALD), for example. As another example, silicon nitride may be a silicon-rich silicon nitride or an oxygen-rich silicon nitride. Silicon nitride may contain some oxygen, but not so much that the materials dielectric constant is substantially different from that of high purity stoichiometric silicon nitride.

It is noted that terms such as top, bottom, and under may be used in this disclosure. These terms should not be construed as limiting the position or orientation of a structure or element, but should be used to provide spatial relationship between structures or elements.

Drain extended transistors can include drain-extended NMOS (DENMOS), drain-extended PMOS (DEPMOS), and/or laterally diffused MOS (LDMOS) transistors, as well as groups of DENMOS and DEPMOS, referred to as complimentary drain extended MOS or DECMOS transistors. Described examples include doped regions of various semiconductor structures which may be characterized as p-doped and/or n-doped regions or portions, and include regions that have majority carrier dopants of a particular type, such as n-type dopants or p-type dopants.

Figure 1:
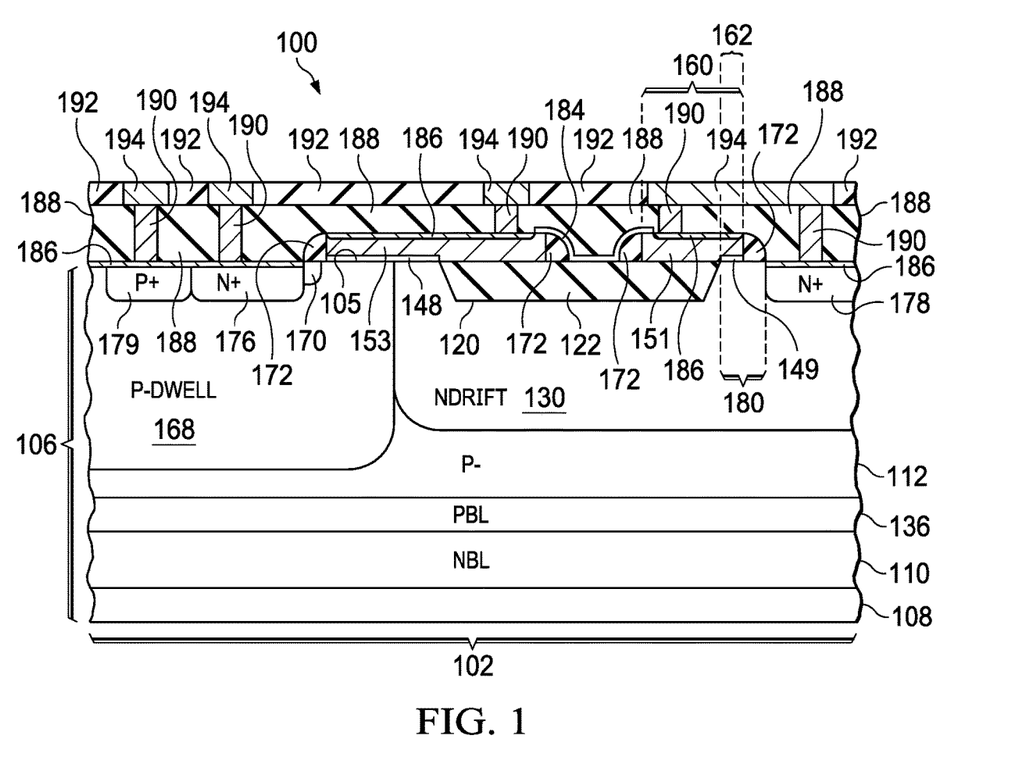
FIG. 1 shows a cross section of a microelectronic device, including a LDMOS transistor with a field plate.

Referring initially to FIG. 1, a microelectronic device 100 is shown in section view, and includes a laterally diffused metal oxide semiconductor (LDMOS) transistor 102 according to one example. While this example is presented as an n-channel device, those skilled in the art will appreciate that an analogous p-channel device may be formed with appropriate substitution of p-type regions for n-type regions and vice-versa. The LDMOS transistor 102 is located in and over an epitaxial layer 106 over a substrate (not shown). The epitaxial layer 106 may be formed initially as a lightly-doped p-type layer, from which other regions of the LDMOS transistor 102 are formed by additional suitable doping. The semiconductor material is not limited to any particular material, but is described throughout as silicon without implied limitation. The LDMOS transistor 102 includes an optional n-type buried layer (NBL) 110 and an optional p-type buried layer (PBL) 136. An unmodified portion 108 of the epitaxial layer 106 may be located between the NBL 110 and the substrate, and an unmodified portion 112 of the epitaxial layer 106 may be located between the PBL 136 and a top surface 105. The unmodified portion 112 is referred to hereinafter as the lightly doped region 112.

A p-type DWELL region 168 and an NDRIFT drift region 130 are located between the substrate and the top surface 105. The p-type DWELL region 168 may operate as a body region of the LDMOS transistor 102, and the NDRIFT drift region 130 may operate as an extended drift region of the LDMOS transistor 102. Within the p-type DWELL region 168 are an n-type DWELL region 170, a source region 176 and a backgate region 179. Within the NDRIFT drift region 130 is a drain region 178. A field relief dielectric layer 122 extends between the source region 176 and the drain region 178, and is spaced apart from the drain region 178 by a field relief space 180. In the illustrated example the field relief dielectric layer 122 fills a field isolation trench 120, while in other examples the field relief dielectric layer 122 may include a local-oxidation-of-silicon (LOCOS) structure.

A junction between the NDRIFT drift region 130 and the p-type DWELL region 168 is located between the source region 176 and the field relief dielectric layer 122. A gate dielectric layer 148 is located over the junction, and extends over the junction from the n-type DWELL region 170 to the field relief dielectric layer 122. A gate electrode 153 extends from the n-type DWELL region 170 toward the drain region 178 over the gate dielectric layer 148 and partially over the field relief dielectric layer 122.

A field plate dielectric layer 149 extends partially over the field relief space 180 from the field relief dielectric layer 122 toward the drain region 178 by a field plate overlap 162. A field plate 151 has a width 160, partially overlying the field plate dielectric layer 149 and extending over the field relief dielectric layer 122. Dielectric sidewall spacers 172 cover sidewalls of the field plate 151 and the gate electrode 153. A silicide block layer 184 overlies adjacent instances of the dielectric sidewall spacers 172 between the field plate 151 and the gate electrode 153, and a portion of the field relief dielectric layer 122 between the adjacent dielectric sidewall spacers 172.

Metal silicide layers 186 form ohmic electrical connections to the backgate region 179, the source region 176 and the drain region 178. Contacts 190 extend vertically from the metal silicide layers 186 through a pre-metal dielectric (PMD) layer 188 to interconnects 194 separated by portions of an inter-metal dielectric (IMD) layer 192. One instance of the interconnects 194 electrically (e.g. conductively) connects the drain region 178 to the field plate 151. Thus FIG. 1 illustrates an example in which the field plate 151 is optionally a drain-tied field plate. The silicide block layer 184 may be used to increase the space between the metal silicide layers 186 on the gate electrode 153 and field plate 151 to reduce the possibility of dielectric breakdown between the gate electrode 153 and field plate 151 when the field plate 151 is at the same potential as the drain region 178. In the example in which the field plate 151 is a drain-tied field plate, the ruggedness of the LDMOS transistor 102 may be improved relative to analogous analogs in which the field plate 151 is not tied to the drain region 178. Such enhanced ruggedness may result from accumulation of electrons under the drain-tied field plate 151 during operation, similar to the effect of a n-buffer doping implant.

Some baseline LDMOS devices are configured such that when operated under reverse bias an edge of a depletion region between the lightly doped region 112 and the NDRIFT drain region 130 may reach the drain region, such as the drain region 178 shown in FIG. 1. This event may lead to snap-back breakdown at a reverse bias voltage Vsnap, which may be detrimental to device performance. In contrast, examples of the present disclosure provide the field plate 151 located over the interface between the field relief dielectric layer 122 and the NDRIFT drain region 130 on the drain side. The field relief dielectric layer 122 extends from the gate dielectric layer 148 toward the drain region 178 and has a thickness greater than the gate dielectric layer 148 and the field plate dielectric layer 149. Such placement of the field plate 151 is expected to result in the termination of electric field lines, thereby reducing the drain-to-source breakdown voltage (BVDSS) relative to what it would be without the field plate 151, in which case a snap-back breakdown would be expected to occur under reverse bias when the depletion edge reaches the drain region 178 (described below with respect to FIG. 1I).

When the drain-to-source voltage VDS reaches BVDSS during operation, breakdown of the semiconductor may begin near the drain region 178, for example at or near the lower corner of the field relief dielectric layer 122 closest to the drain region 178, initiating avalanche breakdown with the drain voltage relatively constant. As VDS increases, the device may enter a strong injection regime, at which point the drain voltage begins to increase. The region of strong injection increases in extent as VDS increases further, and device damage or destruction may result when the strong injection region reaches the drain region 178 or overlying silicide 186. The overlap of the NDRIFT drain region 130 by the field plate 151 results in the field relief space 180 by blocking the formation of the metal silicide layer 186 under the field plate 151. Thus the field plate 151 acts as a silicide blocking structure extending from the field relief dielectric layer 122 to the drain region 178. Blocking the silicide layer 186 from being formed between the field relief dielectric layer 122 and the drain region 178 increases the silicon path length between the avalanche breakdown initiation point and the nearest edge of the drain region 178 and/or the silicide layer 186 over the drain region 178. Thus, the field plate 151 is expected to result in a low-current avalanche breakdown before the depletion edge reaches the field plate 151, at the expense of reduced breakdown voltage. This tradeoff is contrary to conventional practice, which prioritizes greater breakdown voltage. While the low-current BVDSS failure mechanism reduces breakdown voltage, the high-current NPN breakdown mechanism is unaffected or improved based on the field plate overlap 162 of NDRIFT silicon. The overall result is increased SOA and increased ruggedness of the LDMOS transistor 102.

Figure 2:
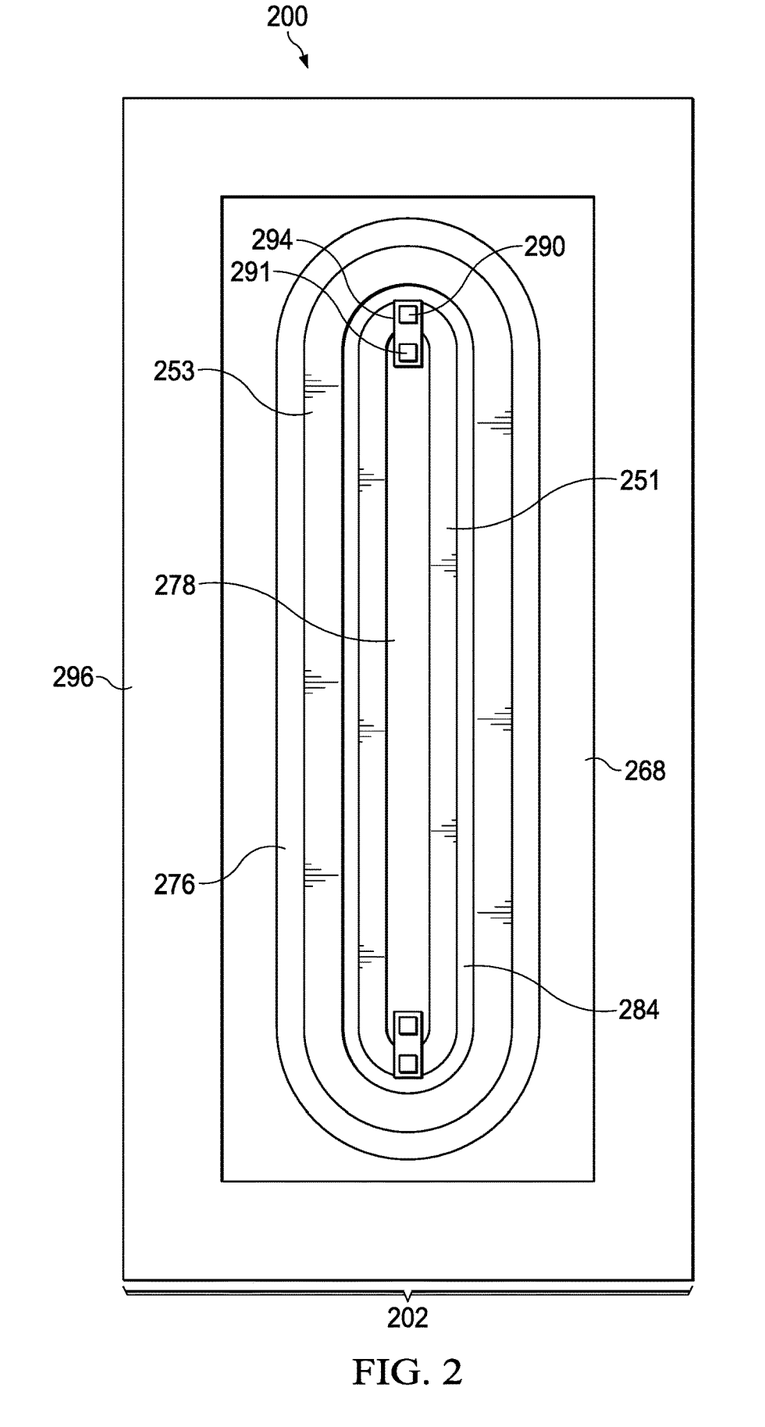
FIG. 2 depicts a top-down figure of a microelectronic device including a LDMOS transistor where the gate electrode and polycrystalline silicon layer are in a "racetrack" or closed-loop configuration, according to one example.

FIG. 2 is a top view of an example microelectronic device 200 that includes an LDMOS transistor 202 with a field plate 251 to enhance LDMOS ruggedness, where a source 276, gate electrode 253 and the field plate 251 are in a "racetrack" or closed-loop configuration around a drain 278 according to an example implementation. The section view of FIG. 1 is representative of a section through the LDMOS transistor 202 taken through the source 276, the gate electrode 253, the field plate 251 and the drain 278. The field plate 251 can be formed with rounded corners to reduce electric fields that might otherwise be present at sharp corners. In this context, the term "corner" refers to the transition of the direction of the field plate 251 from one direction to another direction, e.g. a transition from a first direction to an orthogonal second direction. In one example the field plate 251 follows a path which has rounded corners with radii greater than a thickness of the field plate 251. A silicide block layer 284 is between the gate electrode 253 and the field plate 251. A field plate contact 290 is connected from the field plate 251 to a drain contact 291 and a drain 278 through a metal interconnect 294 by way of example. An isolation tank 296 along with DWELL 268 is shown framing the LDMOS transistor 202 which as described above can comprise an NBL region together with an N+ sinker (neither explicitly shown) providing a vertical connection between a top surface of a device substrate to the NBL region. While FIG. 2 shows a LDMOS transistor 202 with a drain centered closed-loop configuration, a source centered closed-loop configuration is within the scope of the present disclosure.

Shown in FIG. 1A through FIG. 1I is a method of forming the microelectronic device 100 including the n-channel LDMOS transistor 102. It will be clear that an analogous p-channel metal oxide (PMOS) LDMOS transistor can be formed by substituting n-doped regions by p-doped regions and vice versa. In the case of an n-channel LDMOS transistor, a p-type region may be described as having a "first conductivity type" and an n-type region may be described as having a "second conductivity type". Likewise, in the case of a p-channel LDMOS transistor, an n-type region may be described as having a first conductivity type and a p-type region may be described as having a second conductivity type.

Figure 1A:
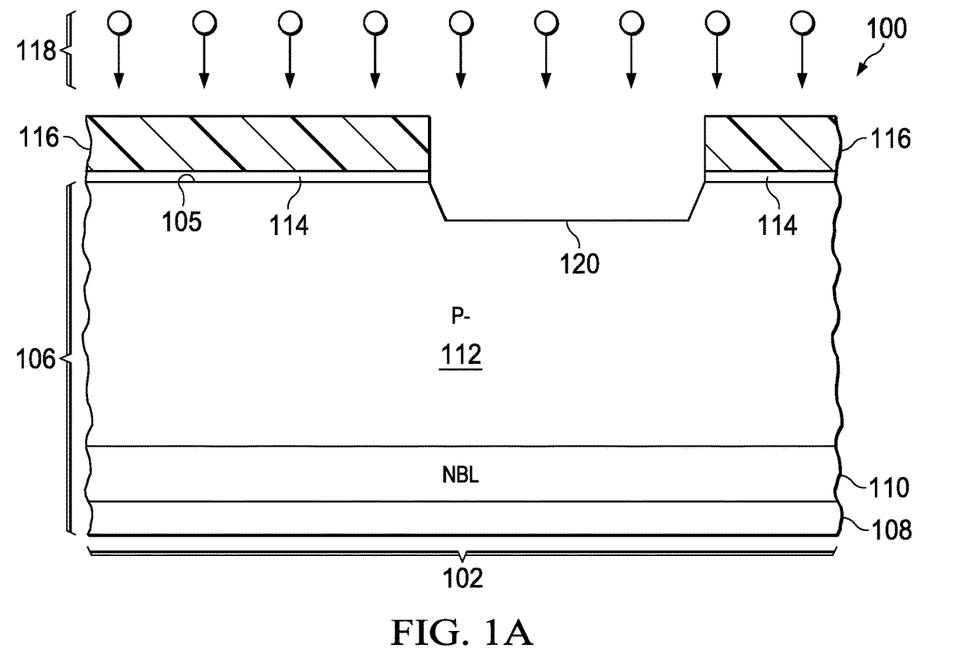
FIG. 1A through FIG. 1I show cross sections of the microelectronic device of FIG. 1 depicted in various stages of formation.

FIG. 1A shows a microelectronic device 100 which includes a substrate including the epitaxial layer 106. The epitaxial layer 106 may, for example, be formed over a bulk semiconductor wafer, a silicon-on-insulator (SOI) wafer, or other structure suitable for forming the microelectronic device 100. A base wafer may be p-type with a dopant concentration of $10^{17}$ atoms/cm$^3$ to $10^{18}$ atoms/cm$^3$, for example. Alternatively, the base wafer may be lightly doped, meaning the base wafer has an average dopant concentration below $10^{16}$ atoms/cm$^3$.

At the illustrated stage of manufacturing the optional NBL 110 has been formed within the epitaxial layer 106. The NBL 110 may be 2 μm to 10 μm thick, by way of example, and may have a dopant concentration of $10^{17}$ atoms/cm$^3$ to $10^{18}$ atoms/cm$^3$. The lightly doped region 112 extends from the NBL 110 and the top surface 105. The lightly doped region 112 may be 2 μm to 12 μm thick, for example. The lightly doped region 112 is p-type in the example in which the LDMOS transistor 102 is an n-channel device, and may have a dopant concentration of $10^{15}$ atoms/cm$^3$ to $10^{16}$ atoms/cm$^3$, by way of example. In versions of this example in which the NBL 110 is omitted, the unmodified portion 108 is an extension of the lightly doped region 112.

A pad oxide layer (not specifically shown) of silicon dioxide may be formed on the lightly doped region 112. The pad oxide layer may include silicon dioxide that is formed by a thermal oxidation process or a chemical vapor deposition (CVD) process. The pad oxide layer provides stress relief between the lightly doped region 112 and subsequent layers. The pad oxide layer may be 5 nm to 50 nm thick, by way of example. A CMP stop layer 114 is then deposited and a photomask 116 is formed. The CMP stop layer 114 may be silicon nitride or other material with a high selectivity for CMP of oxide materials. The photomask 116 serves the function of masking the CMP stop layer 114 and it may include a light sensitive organic material that is coated, exposed and developed. The photomask 116 step is followed by a plasma etch process 118 which removes the CMP stop layer 114, the pad oxide, and the lightly doped region 112 to form the field isolation trench 120. The field isolation trench 120 may be 250 nm and 1000 nm in depth and will eventually form the field relief dielectric layer 122, shown in FIG. 1B. The field oxide layer in the example LDMOS transistor 102 is formed using a shallow trench isolation (STI) process.

Figure 1B:
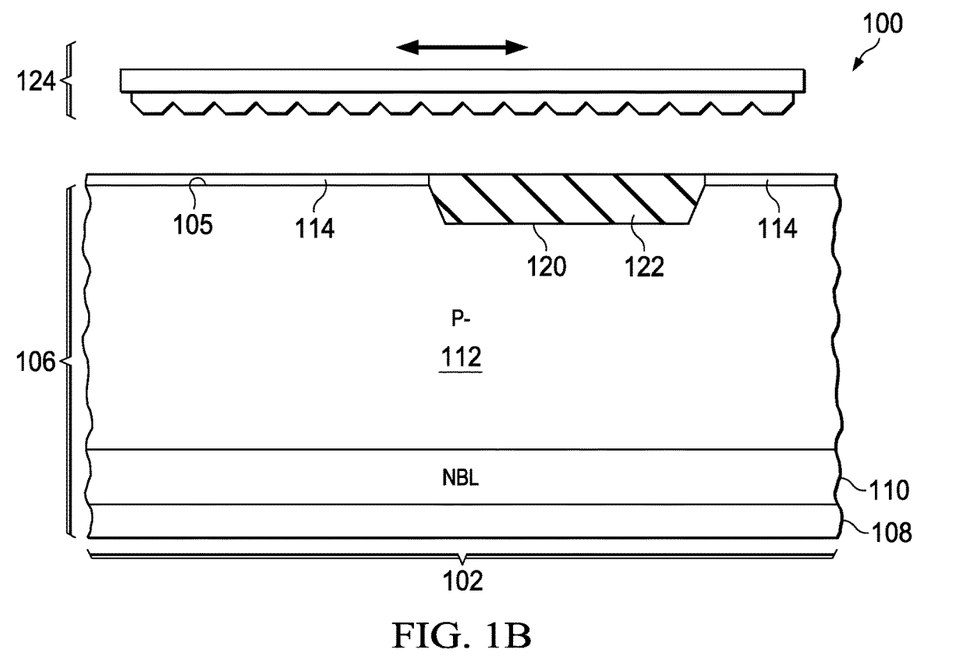

Referring to FIG. 1B, the field relief dielectric layer 122 is formed in the field isolation trench 120 and over the CMP stop layer 114. The field relief dielectric layer 122 may include primarily silicon dioxide, or silicon dioxide-based dielectric material, formed by one or more CVD processes alternated with etch-back processes to provide complete filling of the field isolation trench 120. In the illustrated example the field relief dielectric layer 122 is planarized so that the field relief dielectric layer 122 does not extend over the top surface 105. The field relief dielectric layer 122 may be planarized by a CMP process 124, as indicated in FIG. 1B. In some other examples the field relief dielectric layer 122 is implemented with a LOCOS process. After the field relief dielectric layer 122 is planarized, the CMP stop layer 114 is removed. The CMP stop layer 114 may be removed by a wet etch process using an aqueous solution of phosphoric acid at 140° C. to 170° C. The pad oxide may optionally be removed by a wet etch process using an aqueous solution of buffered hydrofluoric acid. The field relief dielectric layer 122 forms a field oxide stress relief region for the LDMOS transistor 102.

Figure 1C:
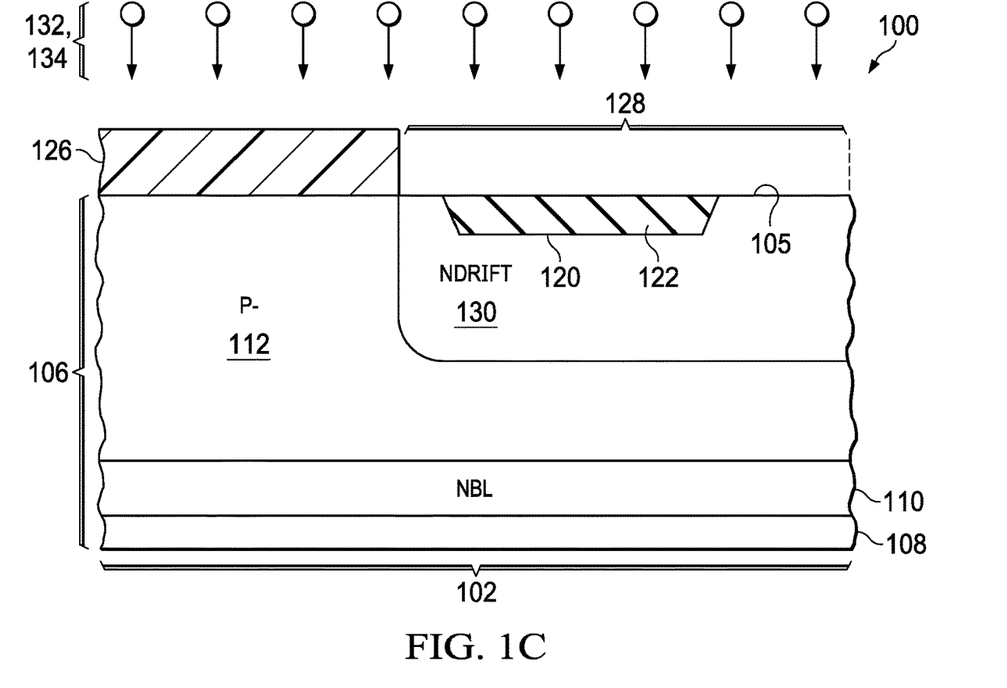

Referring to FIG. 1C, a photomask 126 is deposited and patterned with an opening in region 128 where a drift region (NDRIFT) implant is to be implanted to form the NDRIFT drain drift region 130 within the exposed areas of the lightly doped region 112. An NDRIFT implant 132 may implant an n-type dopant in one or more steps. In one example, phosphorus is implanted by multiple steps (e.g. a chain implant) resulting in a total dose of between $3 \times 10^{12}$ cm$^{-2}$ and $6.6 \times 10^{12}$ cm$^{-2}$ with energies between 0.5 mega-electron volts (MeV) and 2.8 MeV. In some examples arsenic is also implanted at an energy of between 180 kilo-electron volts (keV) and 460 keV with a dose of between $1.5 \times 10^{12}$ cm$^{-2}$ and $3.0 \times 10^{12}$. All of the implant processes use the same photomask 126 to complete the formation of the NDRIFT drain drift region 130.

Figure 1D:
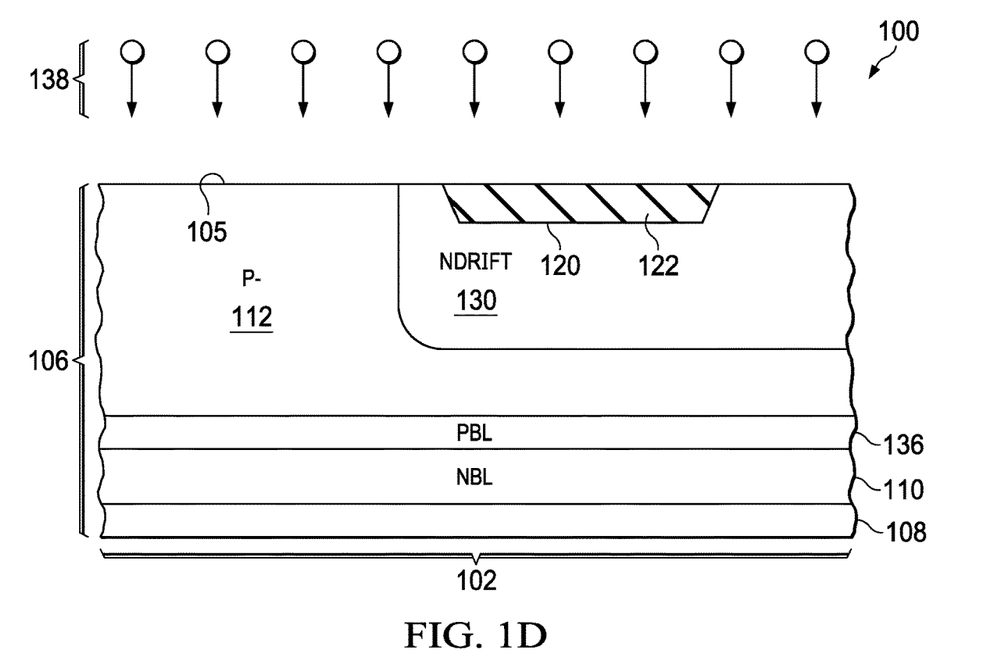

Referring to FIG. 1D, the optional PBL 136 has been formed, e.g. using a high energy p-type implant (PBL implant) 138 to add doping to the lightly doped region 112. The PBL implant 138 can comprise boron at a dose from $3 \times 10^{12}$ cm$^{-2}$ to $5 \times 10^{12}$ cm$^{-2}$ at an energy of between 1.7 MeV and 3 MeV. Indium may also be used as the implant species. For low voltage (e.g., 20 V) versions of the LDMOS transistor 102, the PBL implant 138 can be a blanket implant, while for higher voltage (e.g., >30 V) versions of the LDMOS transistor 102, the PBL implant 138 may be a masked implant to allow selective placement.

Figure 1E:
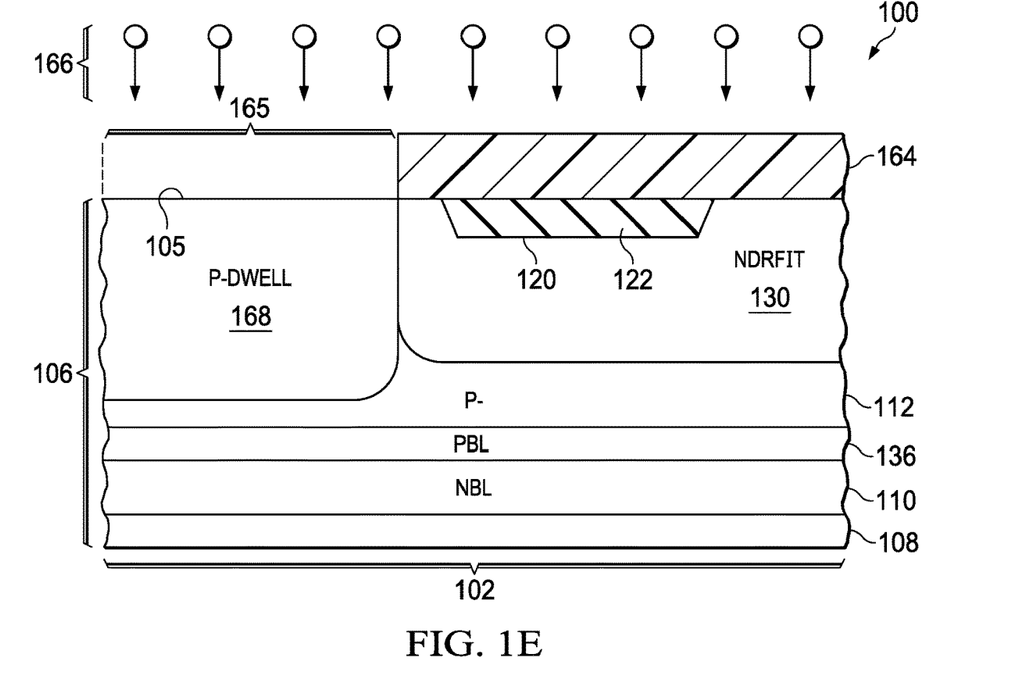

Referring to FIG. 1E, after the wafer is cleaned, an implant mask 164 is formed over the microelectronic device 100 to expose an area 165. A DWELL implant process 166 implants p-type dopants into a portion of the lightly doped region 112 laterally adjacent to the NDRIFT drain drift region 130 including at least a first well ion implant comprising a p-type dopant to form the p-type DWELL region 168. The p-type dopants implanted by the DWELL implant process 166 may include boron. Besides boron, the p-type dopants can include indium (In). Indium, being a relatively large atom, has the advantage of a low diffusion coefficient relative to boron. In the case of a boron implant, the DWELL implant process 166 can be similar in energy to energies used to form p-type source/drain regions or p-type lightly doped drain regions in the epitaxial layer 106, and the dose used should generally be sufficient to enable formation of a channel laterally and to be suppress body NPN effects during operation of the LDMOS transistor 102. For example, a series of boron implants with an energy between 80 keV and 3 MeV, and doses between $4.0 \times 10^{12}$ cm$^{-2}$ to $1.5 \times 10^{14}$ cm$^{-2}$, with a tilt angle of less than 10 degrees may be used to implant the p-type DWELL region 168. After the DWELL implant process 166, a polysilicon oxidation step (not specifically shown). may be carried out. A rapid thermal process (RTP) may be used to activate dopants in the p-type DWELL region 168.

Figure 1F:
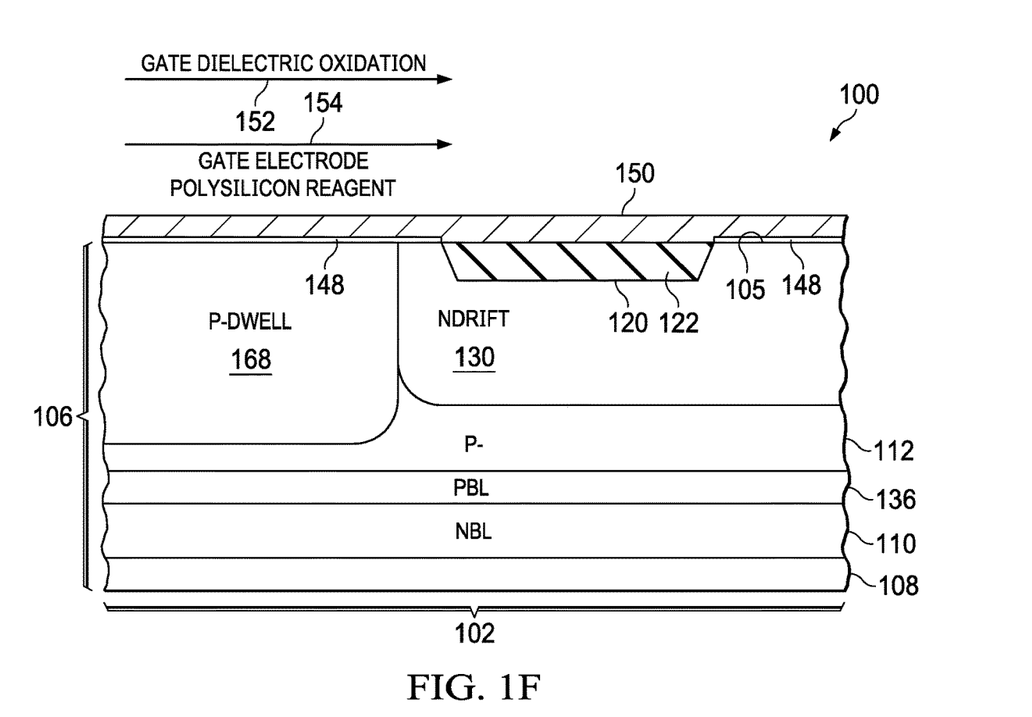

Referring to FIG. 1F, the gate dielectric layer 148 is first formed by an oxidation process 152 that may be implemented by a high temperature furnace operation or a rapid thermal process. The thickness of the gate dielectric layer 148 can range from approximately 3 nm to 15 nm if a silicon dioxide dielectric is used or somewhat less if a silicon oxynitride (SiON) dielectric is used. A gate electrode layer 150 is formed over the gate dielectric layer using any suitable process. In some implementations the gate electrode layer 150 comprises polysilicon, which may be deposited by a gate deposition process 154 that may use a silane-based reagent. In other examples the gate electrode layer 150 may be formed by a metal gate or CMOS-based replacement gate electrode process.

Figure 1G:
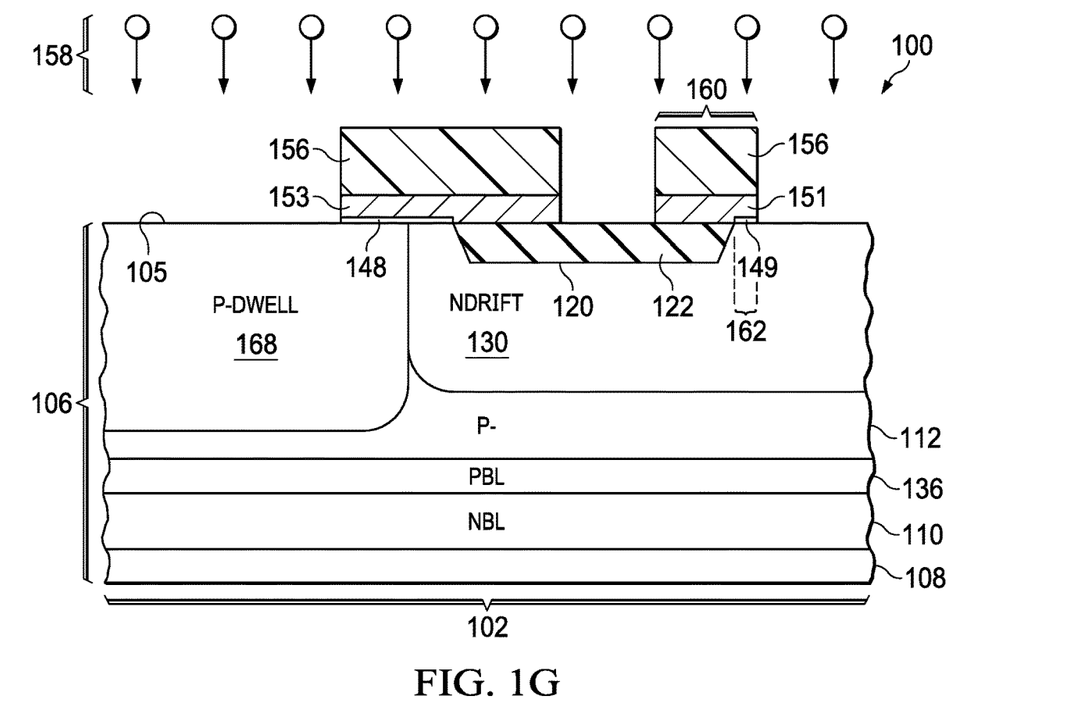

Referring to FIG. 1G, a photomask 156 is deposited over the gate electrode layer 150 and patterned. A plasma etch process 158 defines the gate electrode 153 and the field plate 151, after which the photomask 156. The gate electrode 153 and tied field plate 151 may be spaced apart by between 200 nm and 600 nm thereby providing room for sidewall spacers formed at a later stage of processing. a polysilicon critical dimension of between 100 nm and 300 nm for the field plate 151 is used to allow formation of low sheet resistance silicide. The gate dielectric layer 148 extends from the field relief dielectric layer 122 to and over the p-type DWELL region 168. In the illustrated example, the field plate 151 has the width 160 and overlaps the NDRIFT drain drift region 130 by the field plate overlap 162.

Figure 1H:
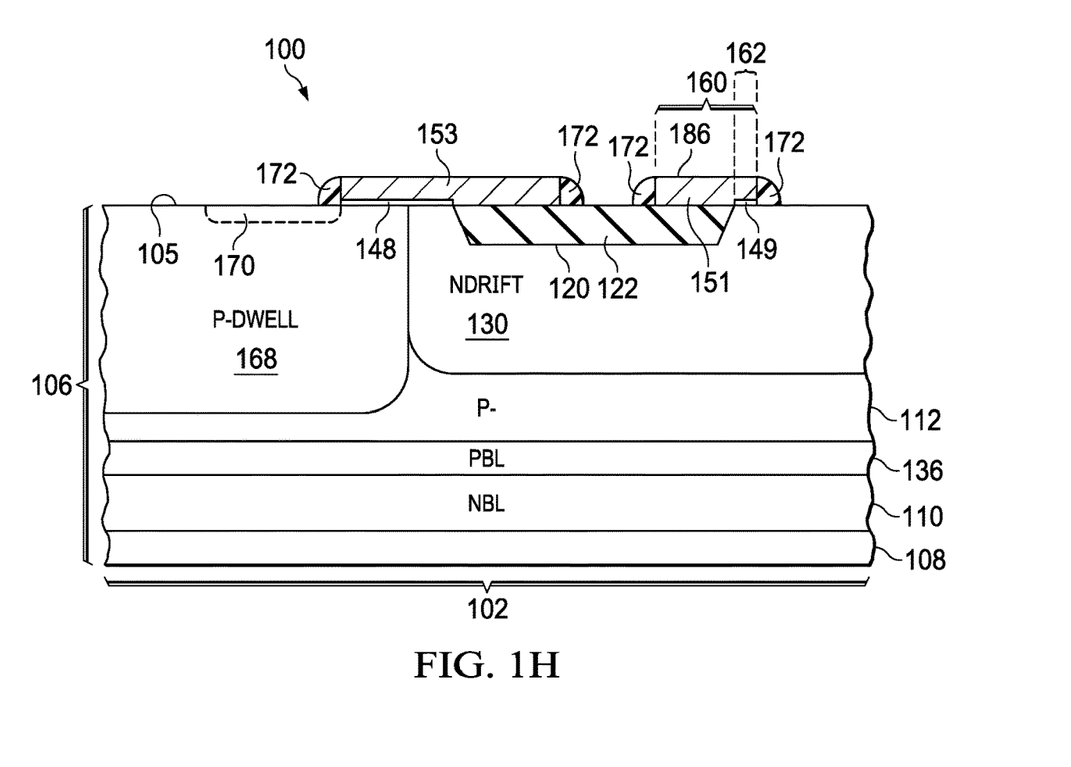

Referring to FIG. 1H, a pattern (resist not specifically shown) and implant step using a n-type dopant such as arsenic or antimony may be used to form an n-type DWELL region 170. For example, arsenic with a dose between $6.0 \times 10^{13}$ cm$^{-2}$ and $8.0 \times 10^{15}$ cm$^{-2}$ with an energy between 60 keV to 120 keV with a tilt angle of between 0 degrees and 45 degrees may be used for the n-type DWELL region 170 dopant. An arsenic energy of greater than 15 keV can allow the arsenic to penetrate through the gate dielectric layer 148 (e.g., when a 5V oxide is used for gate dielectric) adjacent to the gate electrode 153 which reduces the net doping concentration by counter doping so as to reduce gate-induced parametric shifts. The arsenic implant may be implanted at an angle, thereby reducing the channel voltage threshold (Vt) without reducing the p-type DWELL region 168 implant dose, enabling the simultaneous improvement of Vt and control of the body doping of the parasitic NPN. Additionally, the arsenic dose may be made in more than one step to put most of the arsenic dose in the vertical implant and the rest into the angled implant.

After the formation of the n-type DWELL region 170, the dielectric sidewall spacer 172 may be formed on the gate electrode 153 and the field plate 151. The dielectric sidewall spacer 172 may be formed by forming one or more conformal layers of dielectric material over the top surface 105 including the gate electrode 153 and the tied field plate 151. The dielectric material is subsequently removed from horizontal surfaces, that is, surfaces generally parallel to the top surface 105, by an anisotropic etch process such as an RIE process, leaving the dielectric material on the lateral surfaces of the gate electrode 153 and the field plate 151. The dielectric sidewall spacer 172 may include a dielectric material such as silicon dioxide and silicon nitride. The dielectric sidewall spacer 172 may extend 100 nm to 500 nm from the lateral surfaces of the gate electrode 153 and the field plate 151.

Figure 1I:
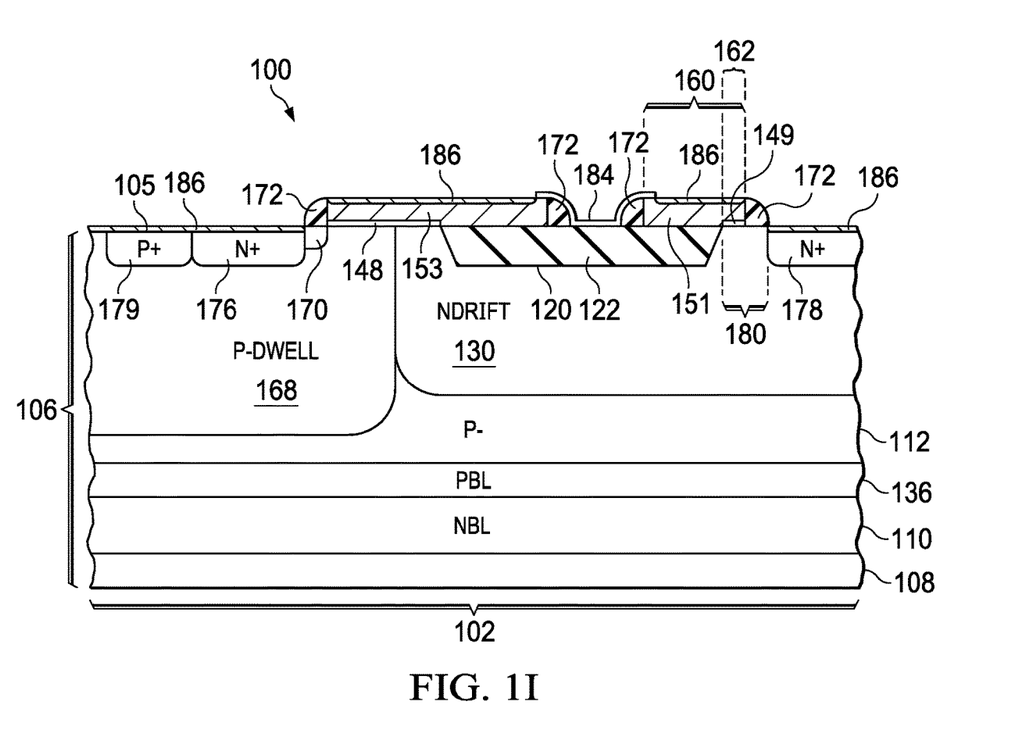

Referring to FIG. 1I, the source region 176, the drain region 178, the backgate region 179, and the silicide block layer 184 are formed. One or more patterning steps (not specifically shown) and one or more ion implantation steps (not specifically shown) are used to implant the source region 176 and a p-type backgate region in the p-type DWELL region 168, and implant the drain region 178 in the NDRIFT drain drift region 130. The source region 176 and the drain region 178 implantation may occur in one or more steps with implant species including one or more of phosphorus and arsenic with an overall dose of between $5 \times 10^{13}$ cm$^{-2}$ and $4.5 \times 10^{15}$ cm$^{-2}$ and an energy between 2 keV and 80 keV. The ion implantation step uses an edge of the dielectric sidewall spacer 172 abutting the drain region 178 to self-align the drain region 178 to the field plate 151. The drain region 178 contains an average dopant density at least twice that of the NDRIFT drain drift region 130. The field plate 151 extends between the drain region 178 and the gate electrode 153 over a distance that is greater than twice the thickness of the field relief dielectric layer 122. In the illustrated example, the field plate 151 may have the field plate overlap 162 of NDRIFT silicon that may range from zero nm to 600 nm. When the field plate overlap 162 of NDRIFT silicon is zero, the dielectric sidewall spacer 172 defines the drain region to the field relief space 180. When the field plate overlap 162 of NDRIFT silicon is greater than zero the sum of the field plate overlap 162 of NDRIFT silicon plus the width of the dielectric sidewall spacer 172 defines the drain region to the field relief space 180. The ability to set the field relief space 180 to a selected value for different transistor designs is advantageous as it allows the BVDSS and snap-back breakdown mechanisms to be selectively adjusted for such designs.

The silicide block layer 184 may be formed by depositing a one or more sublayers of an oxide, a nitride, an oxynitride, or any combination thereof over the top surface 105. The silicide block layer 184 is patterned with a photomask (not specifically shown) and the silicide block layer 184 is removed using a RIE etch process (not specifically shown) in regions of the lightly doped region 112, the gate electrode 153, and the field plate 151 exposed to the RIE etch process where the metal silicide layer 186 is to be formed. The silicide block layer 184 is allowed to remain in areas on the lightly doped region 112, the gate electrode 153, and the field plate 151 at the wafer surface protected by the photomask where the metal silicide layer 186 is not intended to be formed. In at least one implementation, the silicide block layer 184 is not required for LDMOS formation, and may be omitted. After the silicide block layer 184 has been formed, a metal layer (not specifically shown) which forms a metal silicide at temperatures consistent with typical semiconductor manufacturing process conditions is deposited on the wafer surface. The microelectronic device 100 is heated to form the metal silicide layer 186 in exposed regions of the lightly doped region 112, the gate electrode 153, and the field plate 151. Unreacted metal is subsequently removed in a wet stripping process which is not specifically shown.

Further processing results in the device cross section shown in FIG. 1. After the metal silicide layer 186 is formed, the PMD layer 188 is formed. The PMD layer 188 may include a PMD liner (not specifically shown) over the microelectronic device 100 which may be formed from a material selected from the group consisting of silicon nitride, silicon oxynitride and silicon dioxide. The main dielectric sublayer of the PMD layer 188 is formed over the PMD liner if present. The main dielectric sublayer of the PMD layer 188 may be formed by one or more dielectric deposition processes, including a PECVD process using TEOS, a high-density plasma (HDP) process, or a high aspect ratio process (HARP) using TEOS and ozone, by way of example. The PMD layer 188 may be planarized by an oxide CMP process (not specifically shown). Other methods of forming the PMD layer 188 are within the scope of this disclosure.

The contacts 190 may be formed by patterning and etching holes through the PMD layer 188 and the PMD liner if present to expose the metal silicide layer 186. Contacts 190 may be filled by sputtering titanium to form a titanium adhesion layer, followed by forming a titanium nitride diffusion barrier using reactive sputtering or an ALD process. A tungsten core may then be formed by an MOCVD process using tungsten hexafluoride ($WF_6$) reduced by silane initially and hydrogen after a layer of tungsten is formed on the titanium nitride diffusion barrier. The tungsten, titanium nitride, and titanium are subsequently removed from a top surface of the PMD layer 188 by a plasma etch process, a tungsten CMP process, or a combination of both (not specifically shown), leaving the contacts 190 extending to the top surface of the PMD layer 188. The contacts 190 may be formed by a selective tungsten deposition process which fills the contacts 190 with tungsten from the bottom up, forming the contacts 190 with a uniform composition of tungsten. Other methods of forming the contacts 190 are within the scope of this disclosure.

The interconnects 194 are then formed on the contacts 190. In versions of this example in which the interconnects 194 have an etched aluminum structure, the interconnects 194 may be formed by depositing an adhesion layer, an aluminum layer, and an anti-reflection layer, and forming an etch mask (not explicitly shown) followed by an RIE process to etch the anti-reflection layer, the aluminum layer, and the adhesion layer where exposed by the etch mask, and subsequently removing the etch mask.

In versions of this example in which the interconnects 194 have a damascene structure, the interconnects 194 may be formed by forming the IMD layer 192 on the PMD layer 188, and etching the interconnect trenches through the IMD layer 192 to expose the contacts 190. A barrier liner (not specifically shown) may be formed by sputtering tantalum onto the IMD layer 192 and the PMD layer 188 which is exposed and contacts 190, and forming tantalum nitride on the sputtered tantalum by an ALD process. A copper fill metal may be formed by sputtering a seed layer (not explicitly shown) of copper on the barrier liner, and electroplating copper on the seed layer to fill the interconnect trenches. The copper and barrier liner metal are subsequently removed from a top surface of the IMD layer 192 by a copper CMP process (not specifically shown).

In versions of this example in which the interconnects 194 have a plated structure, the interconnects 194 may be formed by sputtering the adhesion layer, containing titanium, on the PMD layer 188 and contacts 190, followed by sputtering a seed layer of copper on the adhesion layer. A plating mask is formed on the seed layer that exposes areas for the interconnects 194. The interconnects 194 are formed by electroplating copper on the seed layer where exposed by the plating mask. The plating mask is removed, and the seed layer and the adhesion layer are removed by wet etching between the interconnects 194. Other methods of forming the interconnects 194 are within the scope of this disclosure.

Figure 3:
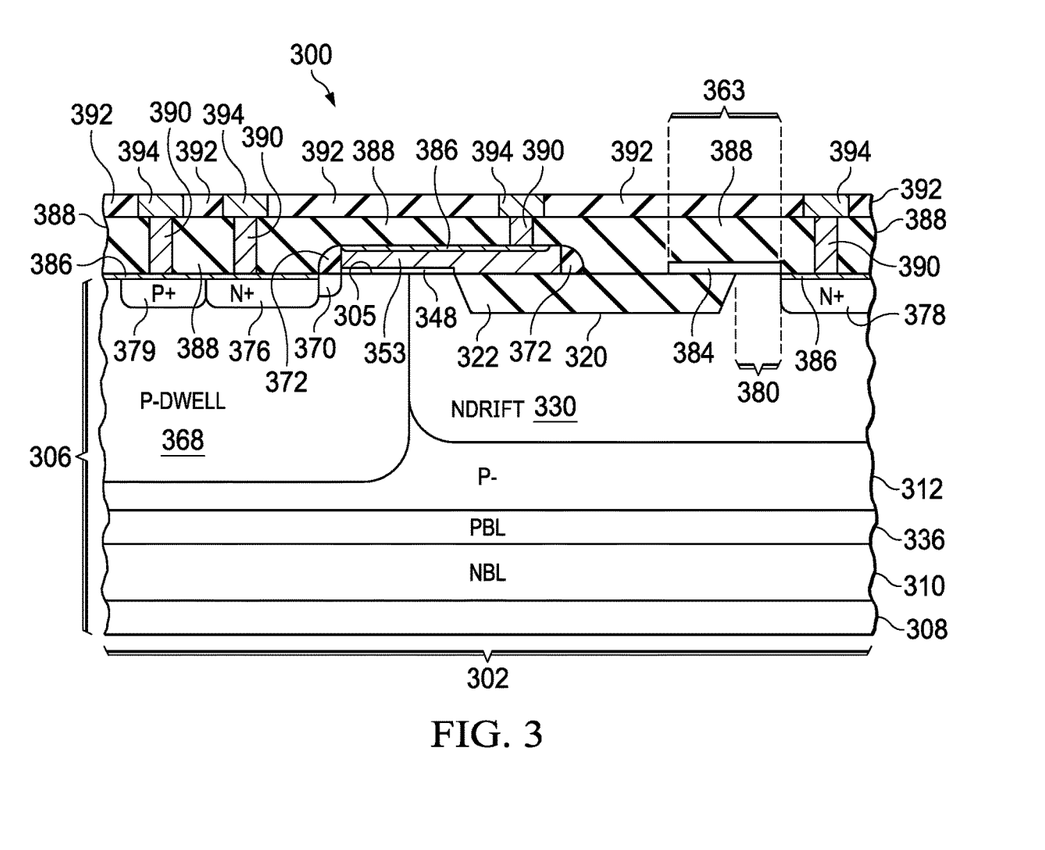
FIG. 3 depicts a cross section of a microelectronic device including a LDMOS transistor with a drain blocking layer.

FIG. 3 presents a cross section of a microelectronic device 300 in which a LDMOS transistor 302 is included. The LDMOS transistor 302 is analogous to the LDMOS transistor 102 with analogous manufacturing processes with exceptions as noted. The microelectronic device 300 contains a substrate 304, a base wafer 308, an NBL layer 310, an epitaxial layer 312, a field isolation trench 320, an, an optional PBL region 336, a gate dielectric layer 348, a gate electrode 353, a p-type DWELL region 368, a n-type DWELL region 370, sidewalls 372, a source region 376, a back gate implant region 379, a silicide layer 386, a PMD layer 388, contacts 390, an IMD layer 392 and interconnects 394.

The LDMOS transistor 302 includes a metal silicide layer 386 analogous to the metal silicide layer 186 (FIG. 1). For the LDMOS transistor 102, the field plate 151 blocked forming the metal silicide layer 186 between the drain region 178 and the field relief dielectric layer 122. In contrast, the LDMOS transistor 302 includes a dielectric silicide blocking layer 384 that prevents the metal silicide layer 386 from forming over at least a portion of a surface 305 of the substrate 304 between a drain region 378 and a field relief dielectric layer 322, shown by space 380. Thus the silicide blocking layer 384 acts as a silicide blocking structure extending from the field relief dielectric layer 322 to the drain region 378. The silicide blocking layer 384 has a silicide blocking layer width 363 that partially overlaps the field relief dielectric layer 322 and extends to the drain region 378 in the illustrated example. In some other examples, the silicide blocking layer extends only part way from the field relief dielectric layer 322 to the drain region 378. In one example the silicide blocking layer 384 is formed in a manner analogous to forming the silicide block layer 184 discussed with respect to FIG. 1I. Dopants used to form the drain region 378 may be excluded from the NDRIFT region 330 adjacent the field relief dielectric layer 322 by suitable patterning of a resist layer used to form implant dopants into the drain region 378. Analogous to the LDMOS transistor 102, the addition of the silicide blocking layer 384 with a silicide blocking layer width 363 extending from the field relief dielectric layer 322 toward the drain region 378 increases the silicon path length between the location at which avalanche breakdown initiates and the nearest edge of the silicide layer 386 and/or drain region 378, which is expected to improve overall SOA. Optionally, to improve ruggedness an n-buffer dopant may be implanted (for an NMOS device) into the NDRIFT region 330 between the field relief dielectric layer 322 and the drain region 378 to increase electron concentration near the surface 305, since the silicide blocking layer 384 cannot be used for this purpose.

Figure 4:
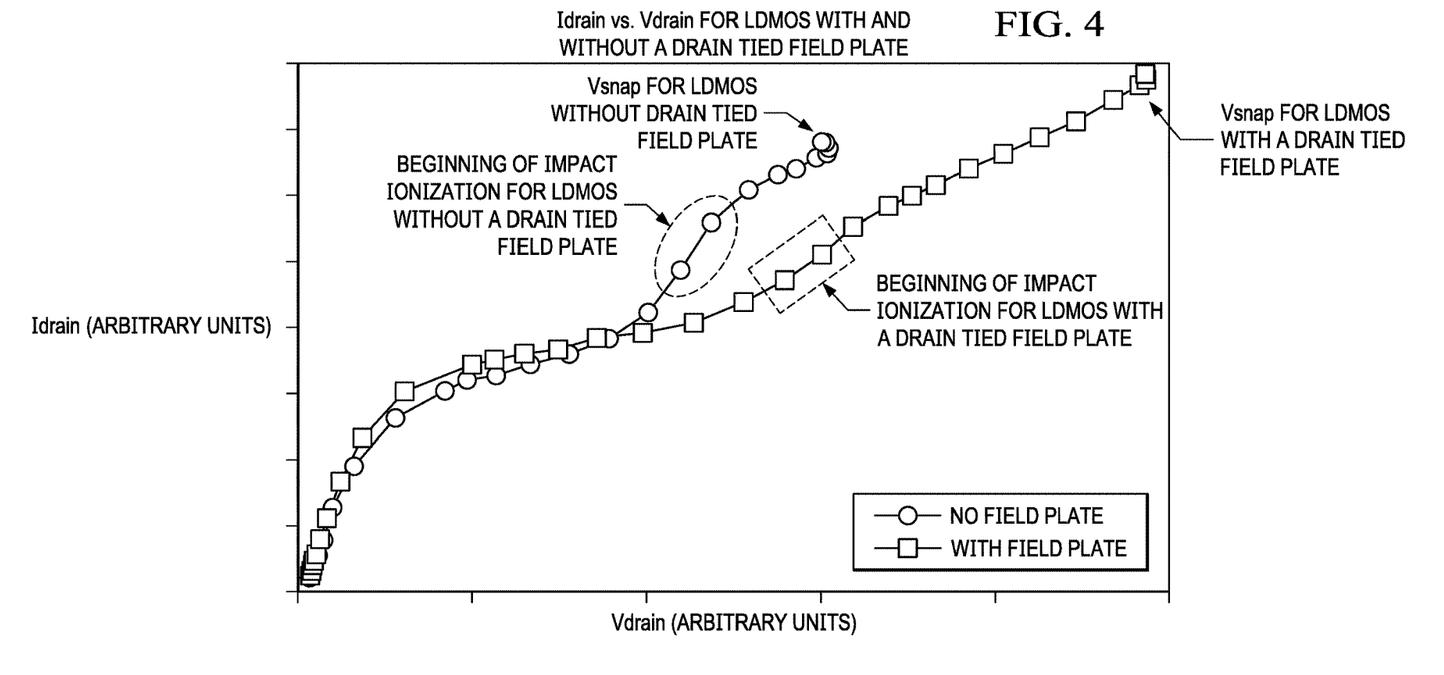
FIG. 4 is a graph of simulated electrical data showing the improvement of snap-back breakdown voltage (Vsnap) and improvement of impact ionization of a LDMOS transistor with a field plate compared to a LDMOS transistor without a field plate.

Referring to FIG. 4, a graph is shown comparing the drain current (Idrain) vs. drain voltage (Vdrain) at a constant gate bias for a LDMOS transistor consistent with the LDMOS transistor 102 (FIG. 1) with the field plate 151 tied to the drain 178, and a LDMOS transistor without a field plate 151 (not specifically shown). The data in FIG. 4 is based on technology computer aided design (TCAD) simulations for a LDMOS transistor 102 and shows an improvement in the snap-back break down voltage (Vsnap) of approximately 60% for the LDMOS transistor 102 with the field plate 151 tied to the drain region 178. In addition, there is an improvement in the onset of impact ionization for the LDMOS transistor 102 with the field plate 151 tied to the drain region 178 (area outlined in dashed rectangular) of approximately 45% compared to the LDMOS transistor without the field plate 151 (area outlined in dashed oval). The estimated overall impact to the SOA with the addition of the field plate 151 tied to the drain region 178 is over 60%.

While various examples of the present disclosure have been described above, it should be understood that they have been presented by way of example only and not limitation. Numerous changes to the disclosed examples can be made in accordance with the disclosure herein without departing from the spirit or scope of the disclosure. Thus, the breadth and scope of the present disclosure should not be limited by any of the above-described examples. Rather, the scope of the disclosure should be defined in accordance with the following claims and their equivalents.

What is claimed is:

1. A microelectronic device, comprising:
a semiconductor material of a substrate, the semiconductor material including a body region having a first conductivity type and a drain drift region having a second conductivity type;
a field relief dielectric layer over the drain drift region, wherein a gate dielectric layer over the body region extends over a junction between the body region and the drain drift region;
a gate electrode over the gate dielectric layer;
a source region having the second conductivity type contacting the body region, the source region having an average dopant density greater than the average dopant density of the body region;
a drain region having the second conductivity type contacting the drain drift region, the drain region having an average dopant density greater than an average dopant density of the drain drift region, the field relief dielectric layer extending from the gate dielectric layer toward the drain region and having a thickness greater than the gate dielectric layer; and
a silicide blocking structure including a sidewall spacer extending from the field relief dielectric layer to the drain region, the drain drift region intersecting a top surface of the substrate between the field relief dielectric layer and the drain region,
wherein the silicide blocking structure includes a polysilicon field plate that extends over the field relief dielectric layer and over the drain drift region between the field relief dielectric layer and the drain region.

2. The microelectronic device of claim 1, wherein the polysilicon field plate is conductively connected to the drain region.

3. The microelectronic device of claim 1, wherein the silicide blocking structure includes a dielectric layer that extends from the field relief dielectric layer toward the drain region and touches an overlying pre-metal dielectric layer.

4. The microelectronic device of claim 1, wherein the field relief dielectric layer includes a shallow trench isolation (STI) structure including silicon dioxide.

5. The microelectronic device of claim 1, wherein the first conductivity type is p-type and the second conductivity type is n-type.

6. The microelectronic device of claim 1, wherein the silicide blocking structure extends over an edge of the field relief dielectric layer.

7. A method of forming a microelectronic device, comprising:
forming a body region and a drain drift region in a semiconductor material of a substrate, the body region having a first conductivity type and the drain drift region having a second conductivity type;
forming a field relief dielectric layer over the drain drift region;
forming a gate dielectric layer over the body region, the gate dielectric layer having a lesser thickness than the field relief dielectric layer and extending over a junction between the body region and the drain drift region;
forming a gate electrode over the gate dielectric layer;
forming a silicide blocking structure over the field relief dielectric layer, the silicide blocking structure being spaced apart from the gate electrode;
forming a drain region having the second conductivity type contacting the drain drift region, the drain region having an average dopant density greater than an average dopant density of the drain drift region, and the silicide blocking structure including a sidewall spacer extending from the field relief dielectric layer toward the drain region over a portion of the drain drift region that intersects a top surface of the substrate, the field relief dielectric layer extending from the gate dielectric layer toward the drain region;
forming a source region having the second conductivity type contacting the body region, the source region having an average dopant density greater than the average dopant density of the body region; and
forming a pre-metal dielectric (PMD) layer over the silicide blocking structure, wherein the silicide blocking structure comprises a dielectric layer that touches the PMD layer in a vertical direction relative to the top surface.

8. The method of claim 7, wherein the silicide blocking structure is formed concurrently with the gate electrode.

9. The method of claim 7, wherein forming the drain region includes implanting dopants of the second conductivity type that are blocked by the silicide blocking structure.

10. The method of claim 7, wherein the silicide blocking structure is located over an edge of the field relief dielectric layer.

11. The method of claim 7, wherein the field relief dielectric layer includes a shallow trench isolation (STI) structure comprising silicon dioxide.

12. The method of claim 7, wherein the first conductivity type is p-type and the second conductivity type is n-type.

13. The method of claim 7, wherein the silicide blocking structure includes a polysilicon layer and further comprising forming the sidewall spacer of a dielectric material abutting the polysilicon layer between the polysilicon layer and the drain region.

14. A microelectronic device, comprising:
a semiconductor material of a substrate, the semiconductor material including a body region having a first conductivity type and a drain drift region having a second conductivity type;
a field relief dielectric layer over the drain drift region, wherein a gate dielectric layer over the body region extends over a junction between the body region and the drain drift region;
a gate electrode over the gate dielectric layer;
a source region having the second conductivity type contacting the body region, the source region having an average dopant density greater than the average dopant density of the body region;
a drain region having the second conductivity type contacting the drain drift region, the drain region having an average dopant density greater than an average dopant density of the drain drift region, the field relief dielectric layer extending from the gate dielectric layer toward the drain region and having a thickness greater than the gate dielectric layer; and
a silicide blocking structure including a sidewall spacer extending from the field relief dielectric layer to the drain region, the drain drift region intersecting a top surface of the substrate between the field relief dielectric layer and the drain region,
wherein the silicide blocking structure includes a dielectric layer that extends from the field relief dielectric layer toward the drain region and touches an overlying pre-metal dielectric layer.

15. A method of forming a microelectronic device, comprising:
   forming a body region and a drain drift region in a semiconductor material of a substrate, the body region having a first conductivity type and the drain drift region having a second conductivity type;
   forming a field relief dielectric layer over the drain drift region;
   forming a gate dielectric layer over the body region, the gate dielectric layer having a lesser thickness than the field relief dielectric layer and extending over a junction between the body region and the drain drift region;
forming a gate electrode over the gate dielectric layer;
   forming a silicide blocking structure over the field relief dielectric layer, the silicide blocking structure being spaced apart from the gate electrode;
   forming a drain region having the second conductivity type contacting the drain drift region, the drain region having an average dopant density greater than an average dopant density of the drain drift region, and the silicide blocking structure including a sidewall spacer extending from the field relief dielectric layer toward the drain region over a portion of the drain drift region that intersects a top surface of the substrate, the field relief dielectric layer extending from the gate dielectric layer toward the drain region; and
   forming a source region having the second conductivity type contacting the body region, the source region having an average dopant density greater than the average dopant density of the body region,
   wherein forming the drain region includes implanting dopants of the second conductivity type that are blocked by the silicide blocking structure.

16. A method of forming a microelectronic device, comprising:
   forming a body region and a drain drift region in a semiconductor material of a substrate, the body region having a first conductivity type and the drain drift region having a second conductivity type;
   forming a field relief dielectric layer over the drain drift region;
   forming a gate dielectric layer over the body region, the gate dielectric layer having a lesser thickness than the field relief dielectric layer and extending over a junction between the body region and the drain drift region;
   forming a gate electrode over the gate dielectric layer;
   forming a silicide blocking structure over the field relief dielectric layer, the silicide blocking structure being spaced apart from the gate electrode;
   forming a drain region having the second conductivity type contacting the drain drift region, the drain region having an average dopant density greater than an average dopant density of the drain drift region, and the silicide blocking structure including a sidewall spacer extending from the field relief dielectric layer toward the drain region over a portion of the drain drift region that intersects a top surface of the substrate, the field relief dielectric layer extending from the gate dielectric layer toward the drain region; and
   forming a source region having the second conductivity type contacting the body region, the source region having an average dopant density greater than the average dopant density of the body region,
   wherein the silicide blocking structure is located over an edge of the field relief dielectric layer.

* * * * *